(12) United States Patent
Lin et al.

(10) Patent No.: US 7,608,532 B2
(45) Date of Patent: Oct. 27, 2009

(54) METHOD OF GROWING NITRIDE SEMICONDUCTOR MATERIAL

(75) Inventors: Hung-Cheng Lin, Jhongli (TW); Jen-Inn Chyi, Jhongli (TW)

(73) Assignee: National Central University, Taoyuan (TW)

( * ) Notice: Subject to any disclaimer, the term of this patent is extended or adjusted under 35 U.S.C. 154(b) by 80 days.

(21) Appl. No.: 12/014,200

(22) Filed: Jan. 15, 2008

(65) Prior Publication Data

US 2009/0162999 A1 Jun. 25, 2009

(30) Foreign Application Priority Data

Dec. 20, 2007 (TW) .............................. 96148945 A (51) Int. Cl.
*H01L 21/28* (2006.01)
*H01L 21/3205* (2006.01)

(52) U.S. Cl. ............... 438/602; 438/235; 257/E21.053; 257/E21.126; 257/E21.127; 257/E21.352; 257/E21.372

(58) Field of Classification Search ................. 438/602, 438/603, 604, 605, 606, 607, 608, 91, 235, 438/237
See application file for complete search history.

(56) References Cited

U.S. PATENT DOCUMENTS

| 6,440,214 | B1 * | 8/2002 | Hooper et al. | ................. | 117/94 |
| 6,806,115 | B2 * | 10/2004 | Koide et al. | ................... | 438/44 |
| 7,182,811 | B2 * | 2/2007 | Ishida | ......................... | 117/91 |
| 7,235,818 | B2 * | 6/2007 | Kim et al. | ...................... | 257/98 |
| 7,358,112 | B2 * | 4/2008 | Barnes et al. | ................. | 438/93 |

* cited by examiner

*Primary Examiner*—David Nhu
(74) *Attorney, Agent, or Firm*—Chun-Ming Shih (57) ABSTRACT

A method of growing nitride semiconductor material and particularly a method of growing Indium nitride is disclosed can increase surface flatness of a nitride semiconductor material and decrease density of V-defects therein. Further, the method can increase light emission efficiency of a quantum well or quantum dots of the produced LED as well as greatly increase yield. The method is also applicable to the fabrications of electronic devices made of nitride semiconductor material and diodes of high breakdown voltage for rectification. The method can greatly increase surface flatness of semiconductor material for HBT, thereby increasing quality of the produced semiconductor devices.

7 Claims, 6 Drawing Sheets

METHOD OF GROWING NITRIDE SEMICONDUCTOR MATERIAL

BACKGROUND OF THE INVENTION

The application claims priority to a Taiwan application No. 096148945 filed Dec. 20, 2007.

1. Field of Invention

The invention relates to methods of growing nitride semiconductor material and more particularly to such a method of growing nitride semiconductor material with improved characteristics including increased flatness and decreased density of V-defects, thereby increasing yield and increasing light emission efficiency of LEDs (light-emitting diodes) made of a material including the nitride semiconductor material.

2. Description of Related Art

The rapid advances in light-emitting diodes (LEDs) have led to the advent of the solid-state lighting era for reduced consumption of natural resources. InGaN alloy is the most promising material for high-efficiency light sources because of its direct band gap nature and widely spanned emission spectrum from ultraviolet to infrared. Moreover, the excellent properties of GaN-based materials such as high temperature stability, high breakdown voltage, high electron velocity, strong piezoelectric effect and high current density let the GaN high electron mobility transistor (HEMTs), Schottky diodes, and hetero-junction bipolar transistors (HBTs) are a good candidate for the applications of high speed and high power.

However, the external quantum efficiencies (EQE) of InGaN green LEDs still falls short of what is required. Poor internal quantum efficiency has been identified to be the bottleneck and has become the focus of intensive studies recently. The fundamental issue of this task is to obtain high quality $In_xGa_{1-x}N$ alloys at a high indium mole fraction, which often leads to low crystalline quality due to indium aggregation and/or phase separation. Furthermore, V-defects are the most common defect that occurs at InGaN/GaN quantum wells of high indium mole fraction. Previous works have demonstrated that the V-shape defects are easily formed in high indium MQW, not only from buffer layer treading dislocations, but also within the MQW because of strain relaxation associated with stacking faults or indium segregation. It is possible of increasing light emission efficiency of LEDs and increasing yield by increasing flatness and decreasing density of V-defects. Thus, it is desirable to provide a novel method of growing nitride semiconductor material.

SUMMARY OF THE INVENTION

It is therefore one object of the invention to provide a method of growing nitride semiconductor material for a plurality of semiconductor devices, the method comprising flowing Triethyl-gallium (TEGa) and ammonia ($NH_3$) into a chamber to grow a first barrier layer; flowing Trimethyl-indium (TMIn) into the chamber to grow a first well layer; stopping flowing TEGa to grow an InN treatment layer in the chamber; stopping flowing TMIn; flowing TEGa into the chamber to grow a second barrier layer; and forming an InN-based LED of multiquantum well (MQW). The method can be applied to the manufacturing of InN MQW LED, InN quantum dots LED structure, rectifier, HBT, or HEMT. By utilizing this method, advantages including increased flatness, decreased density of V-defects, increased yield and increased light emission efficiency of LEDs made of a material including the nitride semiconductor material can be obtained.

The above and other objects, features and advantages of the invention will become apparent from the following detailed description taken with the accompanying drawings.

DETAILED DESCRIPTION OF THE INVENTION

Figure 1:
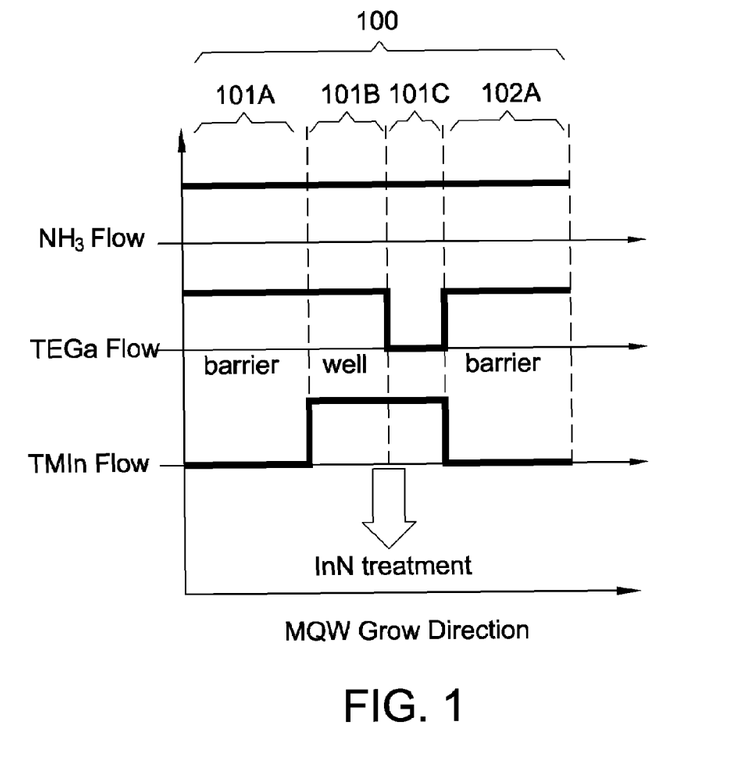
FIG. 1 is a graph showing multiquantum well (MQW) growth direction versus different flows for InN treatment active layer manufactured according to a method of the invention.

Referring to FIG. 1, it is a graph showing multiquantum well (MQW) growth direction versus different flows for InN treatment active layer 100 manufactured according to a method of growing nitride semiconductor material of the invention. The method comprises the following steps.

First, flow Triethyl-gallium (TEGa) and ammonia ($NH_3$) into a chamber to grow a first barrier layer 101A.

Next, flow Trimethyl-indium (TMIn) into the same chamber to grow a first well layer 101B.

Next, stop flowing TEGa to grow an InN treatment layer 101C in the chamber. Next, stop flowing TMIn and flow TEGa into the chamber again to grow a second barrier layer 102A.

Finally, an InN treatment LED of MQW is produced. The LED has a flat MQW structure with decreased density of V-defects and increased light emission efficiency.

Figure 2:
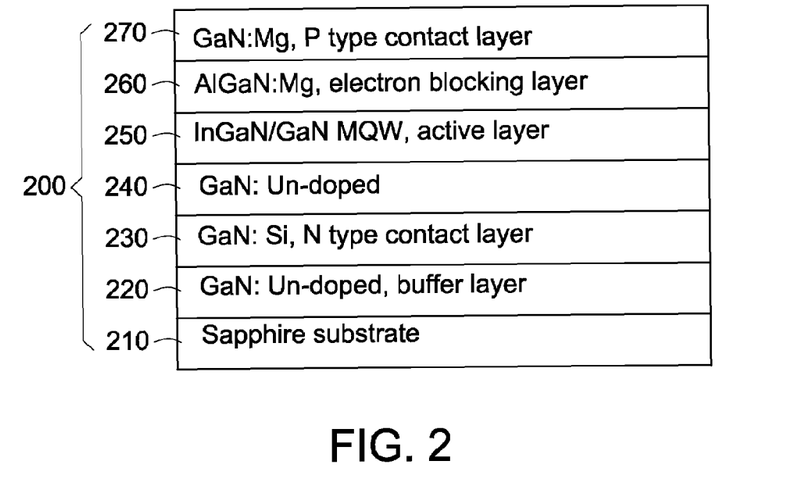
FIG. 2 is a sectional view showing the constituent layers of an InN MQW LED structure manufactured according to the method of the invention.

Referring to FIG. 2, it is a sectional view showing the constituent layers of an InN treatment MQW LED structure 200 manufactured according to the method of the invention. From bottom to top, there are grown of the following components. A sapphire substrate 210 is on the bottom. A gallium nitride (GaN) un-doped buffer layer 220 is deposited on the sapphire substrate 210 by growing. A GaN doped silicon N-type contact layer 230 is deposited on the GaN un-doped buffer layer 220 by growing. A GaN un-doped N-type layer 240 is deposited on the GaN doped silicon N-type contact layer 230 by growing. An InGaN/GaN MQW active layer 250 is deposited on the GaN un-doped N-type layer 240 by growing. An AlGaN magnesium electron blocking layer 260 is deposited on the InGaN/GaN MQW active layer 250 by growing. Finally, a GaN doped magnesium P-type contact layer 270 is deposited on the AlGaN magnesium electron blocking layer 260 by growing.

Figure 3:
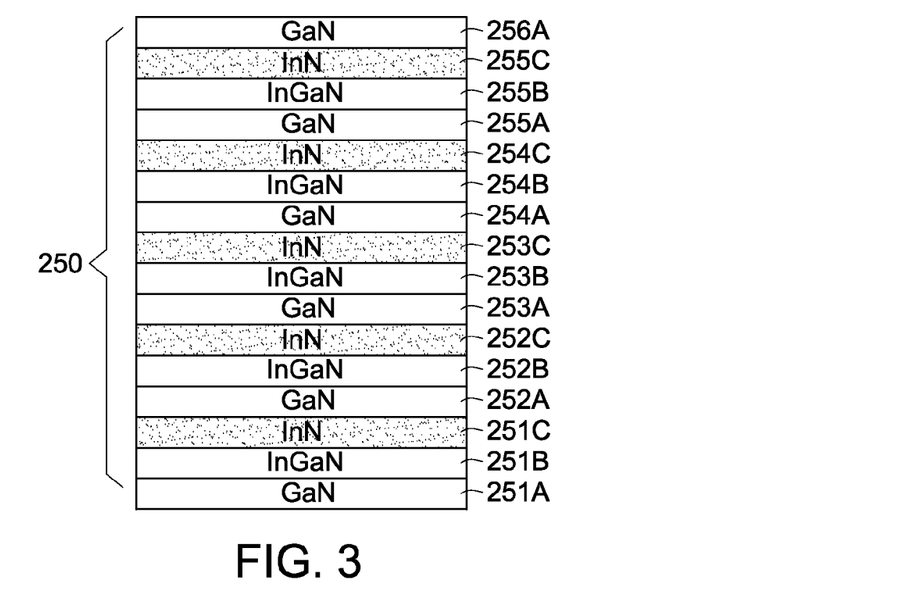
FIG. 3 is a sectional view showing the constituent layers of the InN treatment active layer of FIG. 2.

Referring to FIG. 3, it is a sectional view showing the constituent layers of the InGaN/GaN MQW active layer 250. The InGaN/GaN MQW active layer 250 comprises, from bottom to top, the following components.

First, a first barrier layer 251A is grown. Next, a first well layer 251B is deposited on the first barrier layer 251A by growing. Next, flow TMIn and $NH_3$ into the chamber to grow a first InN treatment layer 251C on the first well layer 251B.

Thereafter, a second barrier layer 252A is deposited on the first InN treatment layer 251C by growing. Next, a second well layer 252B is deposited on the second barrier layer 252A by growing. Next, flow TMIn and $NH_3$ into the chamber to grow a second InN treatment layer 252C on the second well layer 252B.

Thereafter, a third barrier layer 253A is deposited on the second InN treatment layer 252C by growing. Next, a third well layer 253B is deposited on the third barrier layer 253A by growing. Next, flow TMIn and $NH_3$ into the chamber to grow a third InN treatment layer 253C on the third well layer 253B.

Thereafter, a fourth barrier layer 254A is deposited on the third InN treatment layer 253C by growing. Next, a fourth well layer 254B is deposited on the fourth barrier layer 254A by growing. Next, flow TMIn and $NH_3$ into the chamber to grow a fourth InN treatment layer 254C on the fourth well layer 254B.

Thereafter, a fifth barrier layer 255A is deposited on the fourth InN treatment layer 253C by growing. Next, a fifth well layer 255B is deposited on the fifth barrier layer 255A by growing. Next, flow TMIn and $NH_3$ into the chamber to grow a fifth InN treatment layer 255C on the fifth well layer 255B.

Finally, a sixth barrier layer 256A is deposited on the fifth InN treatment layer 255C by growing. An LED has an MQW structure is formed.

Figure 4:
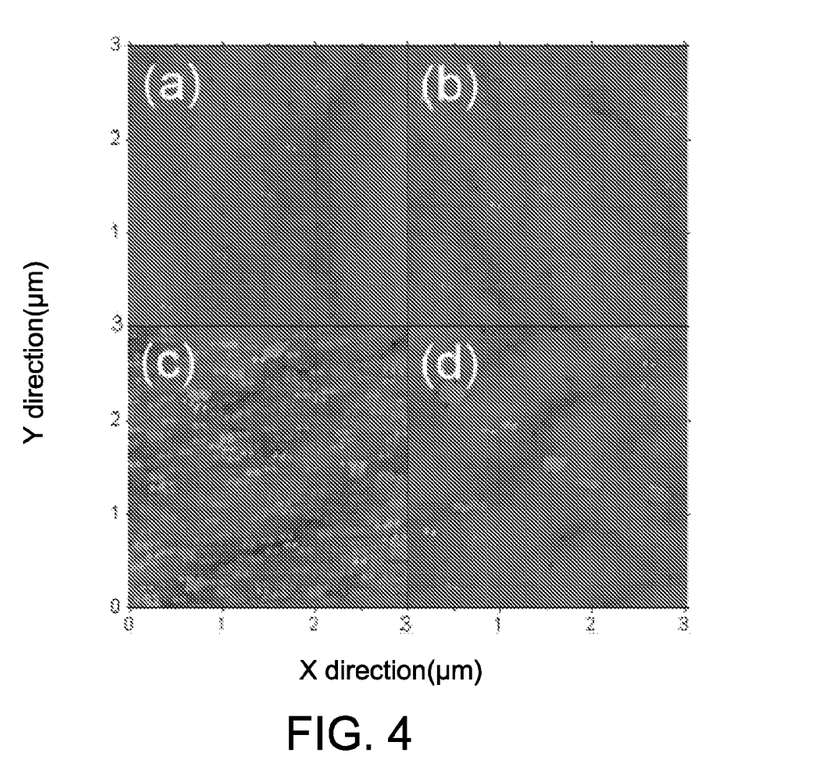
FIG. 4 is an atomic force microscopy (AFM) photograph showing Y direction versus X direction for samples (a), (b), (c) and (d) utilized in the invention.

Referring to FIG. 4, it is an atomic force microscopy (AFM) photograph showing Y direction (μm) versus X direction (μm) for samples (a), (b), (c) and (d) utilized in the invention. The sample (a) shows a single quantum well layer without TMIn treatment. The sample (b) shows a single quantum well layer with TMIn treatment. The sample (c) shows an MQW layer without TMIn treatment. The sample (d) shows an MQW layer with TMIn treatment.

A result of these sample treatments are listed in the following table.

| | Sample | | | |
|---|---|---|---|---|
| | (a) | (b) | (c) | (d) |
| RMS Roughness (nm) | 0.67 | 0.58 | 1.67 | 0.82 |
| Density of V-defects ($cm^{-2}$) | $3.9 \times 10^8$ | $2.9 \times 10^8$ | $7.8 \times 10^8$ | $4.7 \times 10^8$ |

It is found that root mean square (RMS) roughness of a single quantum well layer or MQW layer (e.g., the InGaN/GaN MQW active layer 250) is decreased significantly after treating with TMIn according to the invention.

Figure 5:
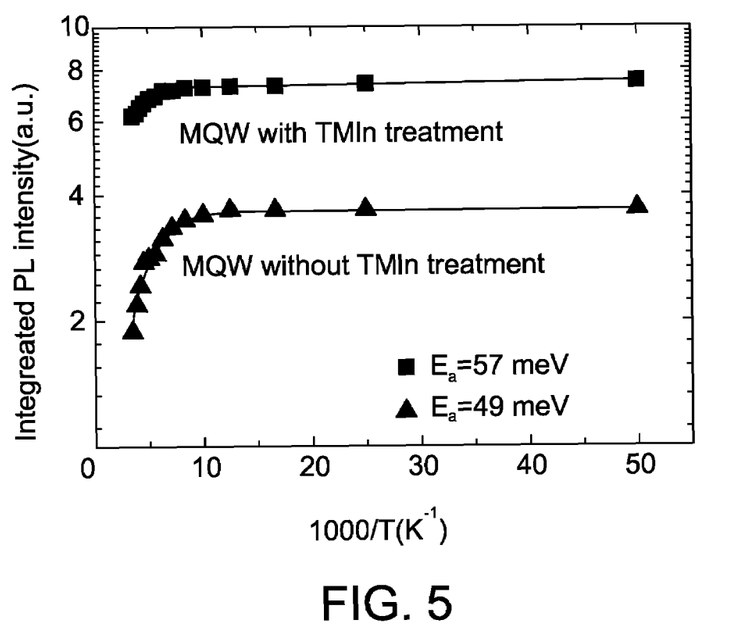
FIG. 5 plots integrated PL intensity versus temperature for the sample (c) having an MQW without TMIn treatment and the sample (d) having an MQW with TMIn treatment.

Referring to FIG. 5, it plots integrated PL (photoluminance) intensity (a.u.) versus temperature ($1000/T$ ($K^{-1}$)) for the sample (c) having an MQW without TMIn treatment and the sample (d) having an MQW with TMIn treatment. It is found that activation energy (Ea) of an MQW layer (e.g., the InGaN/GaN MQW active layer 250) is increased from 49 meV to 57 meV after treating with TMIn according to the invention. Also, light emission strength decrease is maintained to a minimum.

Figure 6:
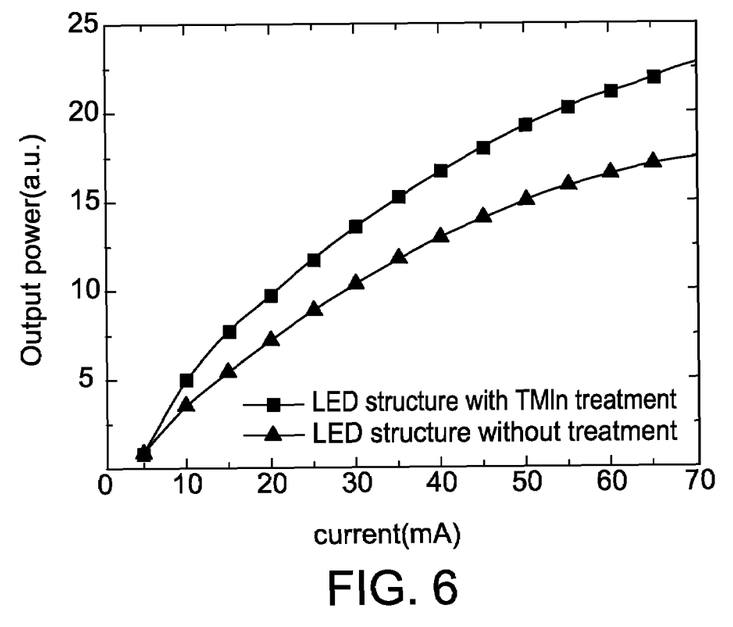
FIG. 6 plots output power versus current for the sample (e) showing an LED structure without TMIn treatment and the sample (f) showing an LED structure with TMIn treatment.

Referring to FIG. 6, it plots output power versus current for the sample (e) showing an LED structure without TMIn treatment and the sample (f) showing an LED structure with TMIn treatment. It is found that light emission strength of the LED structure 200 is increased greatly after treating with TMIn according to the invention.

Figure 7:
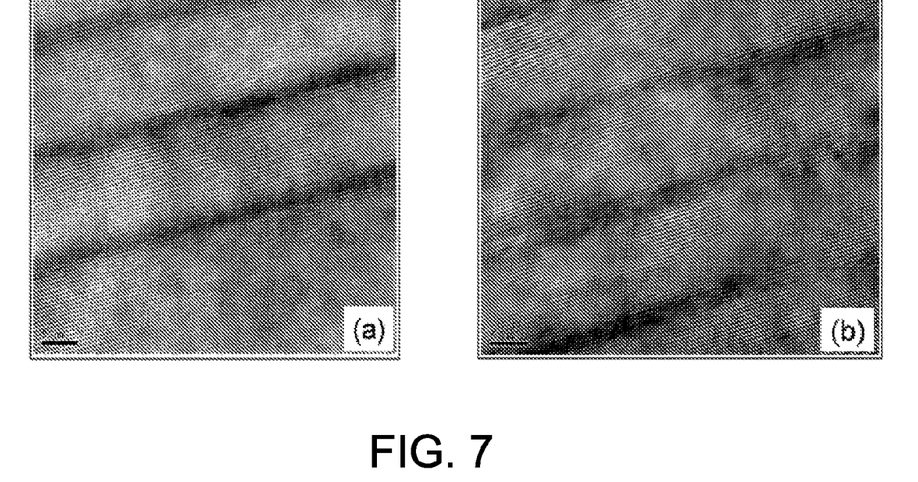
FIG. 7 is a transmission electron microscopy (TEM) photograph showing a quantum well (a) with TMIn treatment and a quantum well (b) without TMIn treatment according to the invention.

Referring to FIG. 7, it is a transmission electron microscopy (TEM) photograph showing a quantum well (a) with TMIn treatment and a quantum well (b) without TMIn treatment. It is found that surface of the quantum well is more flat after treating with TMIn according to the invention.

Figure 8:
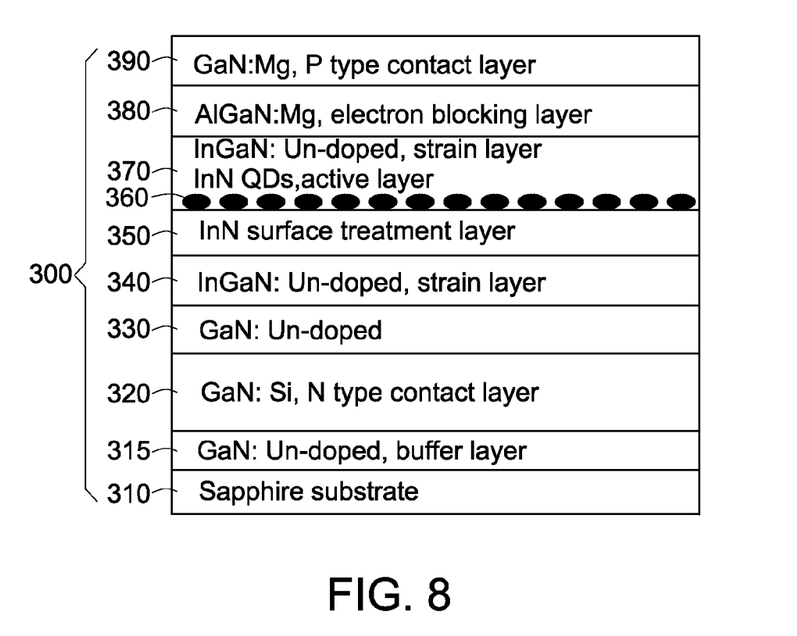
FIG. 8 is a sectional view showing the constituent layers of InN quantum dots LED structure manufactured according to the method of the invention.

Referring to FIG. 8, it is a sectional view showing the constituent layers of InN quantum dots LED structure 300 manufactured according to the method of the invention. From bottom to top, there are grown of the following components. A sapphire substrate 310 is on the bottom. A GaN un-doped buffer layer 315 is deposited on the sapphire substrate 310 by growing. A GaN doped silicon N-type contact layer 320 is deposited on the GaN un-doped buffer layer 315 by growing. A GaN un-doped N-type layer 330 is deposited on the GaN doped silicon N-type contact layer 320 by growing. An InGaN un-doped strain layer 340 is deposited on the GaN un-doped N-type layer 330 by growing. An InN surface treatment layer 350 is deposited on the InGaN un-doped strain layer 340 by flowing TMIn and $NH_3$ into the chamber. An InN quantum dots (QDs) active layer 360 is deposited on the InN surface treatment layer 350 by growing. An InGaN un-doped strain layer 370 is deposited on the InN QDs active layer 360 by growing. An AlGaN magnesium electron blocking layer 380 is deposited on the InGaN un-doped strain layer 370 by growing. Finally, a GaN doped magnesium P-type contact layer 390 is deposited on the AlGaN magnesium electron blocking layer 380 by growing.

Figure 9:
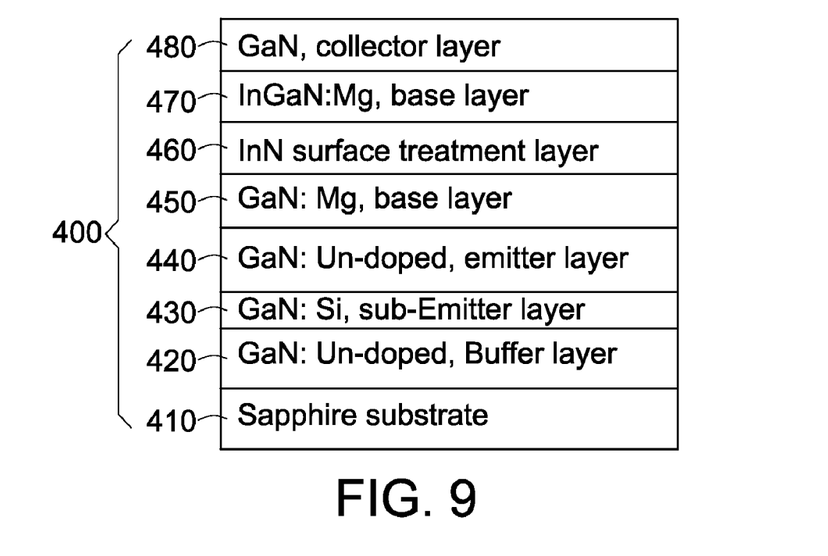
FIG. 9 is a sectional view showing the constituent layers of a HBT structure manufactured according to the method of the invention.

Referring to FIG. 9, it is a sectional view showing the constituent layers of a HBT structure 400 manufactured according to the method of the invention. From bottom to top, there are grown of the following components. A sapphire substrate 410 is on the bottom. A GaN un-doped buffer layer 420 is deposited on the sapphire substrate 410 by growing. A GaN doped silicon sub-emitter layer 430 is deposited on the GaN un-doped buffer layer 420 by growing. A GaN un-doped emitter layer 440 is deposited on the GaN doped silicon sub-emitter layer 430 by growing. A GaN doped magnesium base layer 450 is deposited on the GaN un-doped emitter layer 440 by growing. An InN surface treatment layer 460 is deposited on the GaN doped magnesium base layer 450 by growing. An InGaN doped magnesium base layer 470 is deposited on the InN surface treatment layer 460 by flowing TMIn and $NH_3$ into the chamber. Finally, a GaN collector layer 480 is deposited on the InGaN doped magnesium base layer 470 by growing. Surface of the HBT structure 400 has a relatively low roughness.

Figure 10:
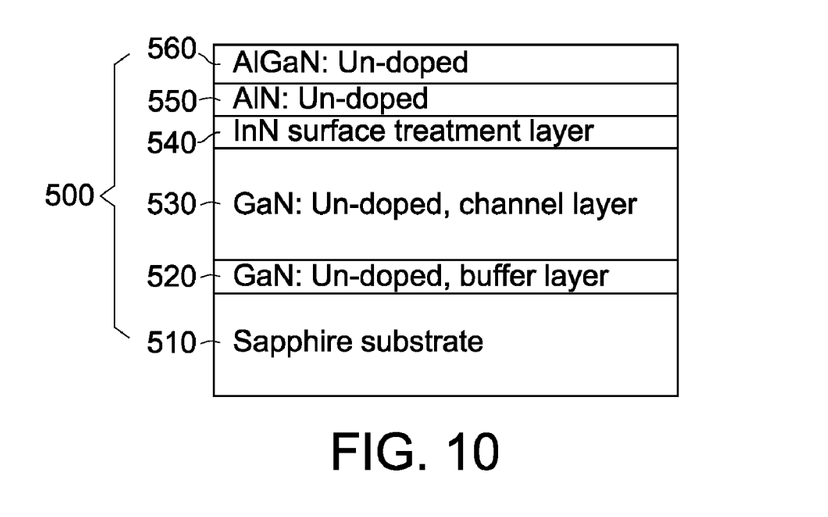
FIG. 10 is a sectional view showing the constituent layers of a HEMT structure manufactured according to the method of the invention.

Referring to FIG. 10, it is a sectional view showing the constituent layers of a HEMT structure 500 manufactured according to the method of the invention. From bottom to top, there are grown of the following components. A sapphire substrate 510 is on the bottom. A GaN un-doped buffer layer 520 is deposited on the sapphire substrate 510 by growing. A GaN un-doped channel layer 530 is deposited on the GaN un-doped buffer layer 520 by growing. An InN surface treatment layer 540 is deposited on the GaN un-doped channel layer 530 by flowing TMIn and NH₃ into the chamber. An AlN un-doped layer 550 is deposited on the InN surface treatment layer 540 by growing. Finally, an AlGaN un-doped layer 560 is deposited on the AlN un-doped layer 550 by growing. Surface of the HEMT structure 500 has a relatively low roughness.

Figure 11:
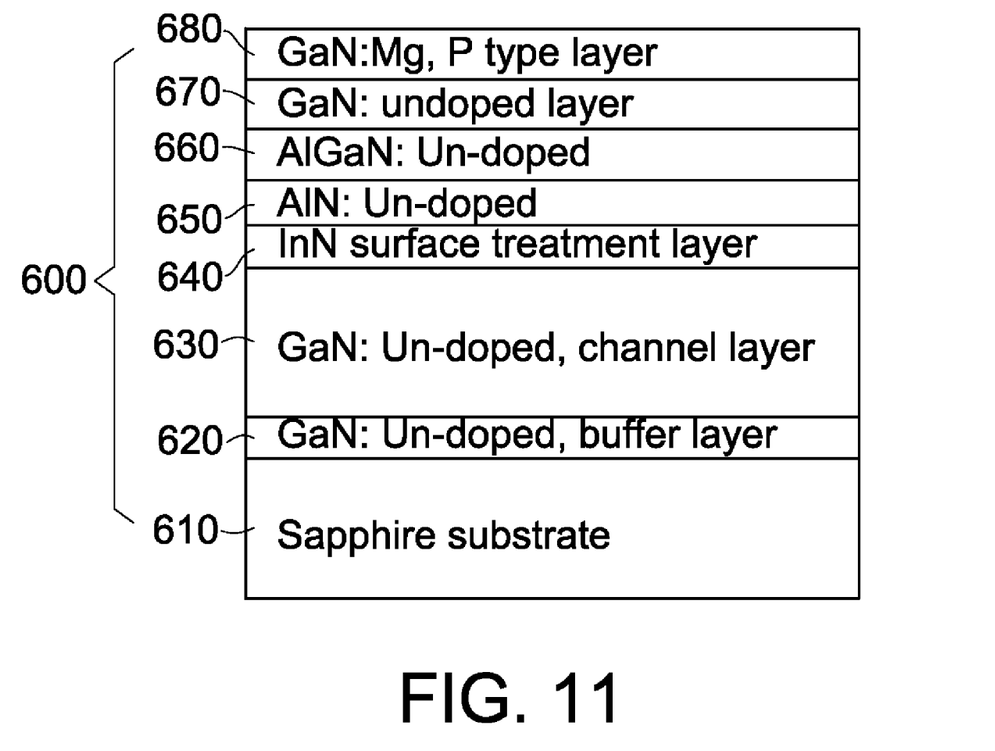
FIG. 11 is a sectional view showing the constituent layers of a rectifier structure manufactured according to the method of the invention.

Referring to FIG. 11, it is a sectional view showing the constituent layers of a rectifier structure 600 manufactured according to the method of the invention. From bottom to top, there are grown of the following components. A sapphire substrate 610 is on the bottom. A GaN un-doped buffer layer 620 is deposited on the sapphire substrate 610 by growing. A GaN un-doped channel layer 630 is deposited on the GaN un-doped buffer layer 620 by growing. An InN surface treatment layer 640 is deposited on the GaN un-doped channel layer 630 by flowing TMIn and NH₃ into the chamber. An AlN un-doped layer 650 is deposited on the InN surface treatment layer 640 by growing. An AlGaN un-doped layer 660 is deposited on the InN un-doped layer 650 by growing. A GaN un-doped layer 670 is deposited on the AlGaN un-doped layer 660 by growing. Finally, a GaN doped magnesium P-type layer 680 is deposited on the GaN un-doped layer 670 by growing. Surface of the rectifier structure 600 has a relatively low roughness.

The nitride semiconductor material grown by the method of the invention can be applied to the manufacturing of LED.

While the invention herein disclosed has been described by means of specific embodiments, numerous modifications and variations could be made thereto by those skilled in the art without departing from the scope and spirit of the invention set forth in the claims.

What is claimed is:

1. A method of growing nitride semiconductor material for a plurality of semiconductor devices, comprising the steps of:
flowing Triethyl-gallium (TEGa) and ammonia (NH₃) into a chamber to grow a first barrier layer;
flowing Trimethyl-indium (TMIn) into the chamber to grow a first well layer;
stopping flowing TEGa to grow an Indium Nitrogen (InN) treatment layer in the chamber;
stopping flowing TMIn;
flowing TEGa into the chamber to grow a second barrier layer; and
forming an InN-based light-emitting diode (LED) of multiquantum well (MQW).

2. The method of growing nitride semiconductor material for a plurality of semiconductor devices of claim 1, wherein a first of the semiconductor devices is an InN MQW LED structure formed by:
growing a sapphire substrate;
growing a gallium nitride (GaN) un-doped buffer layer on the sapphire substrate;
growing a GaN silicon based N-type contact layer on the GaN un-doped buffer layer;
growing a GaN un-doped N-type layer on the GaN doped silicon N-type contact layer;
growing an InGaN/GaN MQW active layer on the GaN un-doped N-type layer;
growing an AlGaN magnesium electron blocking layer on the InGaN/GaN MQW active layer; and
growing a GaN doped magnesium P-type contact layer on the AlGaN magnesium electron blocking layer.

3. The method of growing nitride semiconductor material for a plurality of semiconductor devices of claim 2, wherein the InGaN/GaN MQW active layer is formed by:
growing a first barrier layer;
growing a first well layer on the first barrier layer;
flowing TMIn and NH₃ into the chamber to grow a first InN treatment layer on the first well layer;
growing a second barrier layer on the first InN treatment layer;
growing a second well layer on the second barrier layer;
flowing TMIn and NH₃ into the chamber to grow a second InN treatment layer on the second well layer;
growing a third barrier layer on the second InN treatment layer;
growing a third well layer on the third barrier layer;
flowing TMIn and NH₃ into the chamber to grow a third InN treatment layer on the third well layer;
growing a fourth barrier layer on the third InN treatment layer;
growing a fourth well layer on the fourth barrier layer;
flowing TMIn and NH₃ into the chamber to grow a fourth InN treatment layer on the fourth well layer;
growing a fifth barrier layer on the fourth InN treatment layer;
growing a fifth well layer on the fifth barrier layer;
flowing TMIn and NH₃ into the chamber to grow a fifth InN treatment layer on the fifth well layer; and
growing a sixth barrier layer on the fifth InN treatment layer.

4. The method of growing nitride semiconductor material for a plurality of semiconductor devices of claim 1, wherein a second of the semiconductor devices is an InN quantum dots LED structure formed by:
growing a sapphire substrate;
growing a GaN un-doped buffer layer on the sapphire substrate;
growing a GaN doped silicon N-type contact layer on the GaN un-doped buffer layer;
growing a GaN un-doped N-type layer on the GaN doped silicon N-type contact layer;
growing an InGaN un-doped strain layer on the GaN un-doped N-type layer;
growing an InN surface treatment layer on the InGaN un-doped strain layer by flowing TMIn and NH₃ into the chamber;
growing an InN quantum dots (QDs) active layer on the InN surface treatment layer;
growing an InGaN un-doped strain layer on the InN QDs active layer;
growing an AlGaN doped magnesium electron blocking layer on the InGaN un-doped strain layer; and
growing a GaN doped magnesium P-type contact layer on the AlGaN doped magnesium electron blocking layer.

5. The method of growing nitride semiconductor material for a plurality of semiconductor devices of claim 1, wherein a third of the semiconductor devices is a HBT structure formed by:
growing a sapphire substrate;
growing a GaN un-doped buffer layer on the sapphire substrate;
growing a GaN doped silicon sub-emitter layer on the GaN un-doped buffer layer;
growing a GaN un-doped emitter layer on the GaN doped silicon sub-emitter layer;
growing a GaN doped magnesium base layer on the GaN un-doped emitter layer;

growing an InN surface treatment layer on the GaN doped magnesium base layer;

growing an InGaN doped magnesium base layer on the InN surface treatment layer by flowing TMIn and $NH_3$ into the chamber; and growing a GaN collector layer on the InGaN doped magnesium base layer.

6. The method of growing nitride semiconductor material for a plurality of semiconductor devices of claim 1, wherein a fourth of the semiconductor devices is a HEMT structure formed by:

growing a sapphire substrate;

growing a GaN un-doped buffer layer on the sapphire substrate;

growing a GaN un-doped channel layer on the GaN un-doped buffer layer;

growing an InN surface treatment layer on the GaN un-doped channel layer by flowing TMIn and $NH_3$ into the chamber;

growing an AlN un-doped layer on the InN surface treatment layer; and growing an AlGaN un-doped layer on the AlN un-doped layer.

7. The method of growing nitride semiconductor material for a plurality of semiconductor devices of claim 1, wherein a fifth of the semiconductor devices is a rectifier structure formed by:

growing a sapphire substrate;

growing a GaN un-doped buffer layer on the sapphire substrate;

growing a GaN un-doped channel layer on the GaN un-doped buffer layer;

growing an InN surface treatment layer on the GaN un-doped channel layer by flowing TMIn and $NH_3$ into the chamber;

growing an AlN un-doped layer on the InN surface treatment layer;

growing an AlGaN un-doped layer on the InN un-doped layer;

growing a GaN un-doped layer on the AlGaN un-doped layer; and growing a GaN doped magnesium P-type layer on the GaN un-doped layer.

* * * * *